United States Patent
Fuehrer (10) Patent No.: US 12,240,342 B2
(45) Date of Patent: Mar. 4, 2025

(54) PLUG CONNECTOR HAVING INSULATION MONITORING

(71) Applicant: PHOENIX CONTACT E-Mobility GmbH, Schieder-Schwalenberg (DE)

(72) Inventor: Thomas Fuehrer, Blomberg (DE)

(73) Assignee: PHOENIX CONTACT E-MOBILITY GMBH, Schieder-Schwalenberg (DE)

( * ) Notice: Subject to any disclaimer, the term of this patent is extended or adjusted under 35 U.S.C. 154(b) by 541 days.

(21) Appl. No.: 17/628,576

(22) PCT Filed: Jun. 22, 2020

(86) PCT No.: PCT/EP2020/067279
§ 371 (c)(1),
(2) Date: Jan. 20, 2022

(87) PCT Pub. No.: WO2021/018475
PCT Pub. Date: Feb. 4, 2021

(65) Prior Publication Data
US 2022/0250491 A1    Aug. 11, 2022

(30) Foreign Application Priority Data
Jul. 30, 2019    (DE) .................... 10 2019 120 470.4

(51) Int. Cl.
| H01M 10/46 | (2006.01) |
| B60L 53/16 | (2019.01) |
| B60L 53/18 | (2019.01) |
| H01R 13/52 | (2006.01) |
| H01R 13/652 | (2006.01) |

(52) U.S. Cl.
CPC ............... B60L 53/16 (2019.02); B60L 53/18 (2019.02); H01R 13/5227 (2013.01); H01R 13/652 (2013.01); H01R 2201/26 (2013.01)

(58) Field of Classification Search
CPC ........ H02J 7/0042; B60L 53/16; B60L 53/18; B60L 53/53; B60L 53/302; H01R 2201/26; H01R 13/005; H01R 13/533; H01R 13/5227; H01R 13/652
USPC .................. 320/104, 107, 109, 114, 115, 111
See application file for complete search history.

(56) References Cited

U.S. PATENT DOCUMENTS

| 5,266,039 A | 11/1993 | Boyer et al. |
| 2016/0118744 A1 | 4/2016 | Wittrock et al. |
| 2019/0061539 A1 | 2/2019 | Spilger et al. |

(Continued)

FOREIGN PATENT DOCUMENTS

| DE | 102016105311 A1 | 9/2017 |
| DE | 102017215116 A1 | 2/2019 |
| FR | 3041172 A1 | 3/2017 |

(Continued)

Primary Examiner — Edward Tso
(74) Attorney, Agent, or Firm — LEYDIG & VOIT, MAYER, LTD.

(57) ABSTRACT

The invention relates to a plug connector part (1) for electrical connection to a mating plug connector part (3), comprising a housing (10), at least two load contacts (11A, 11B), a protective conductor contact (12) and a grounding element (13) which is arranged in the housing (10) and is electrically connected to the protective conductor contact (12), wherein the grounding element (13) extends, in an electrically contactable manner, on a creep path (K) between the two load contacts (11A, 11B).

15 Claims, 7 Drawing Sheets

(56) References Cited

U.S. PATENT DOCUMENTS

2019/0074620 A1* 3/2019 Moseke ................ B60L 53/16

FOREIGN PATENT DOCUMENTS

| JP | H086390 Y2 | 2/1996 |
| JP | H2509408 Y2 | 9/1996 |

* cited by examiner

PLUG CONNECTOR HAVING INSULATION MONITORING

CROSS-REFERENCE TO PRIOR APPLICATIONS

This application is a U.S. National Phase application under 35 U.S.C. § 371 of International Application No. PCT/EP2020/067279, filed on Jun. 22, 2020, and claims benefit to German Patent Application No. DE 10 2019 120 470.4, filed on Jul. 30, 2019. The International Application was published in German on Feb. 4, 2021 as WO 2021/018475 under PCT Article 21(2).

FIELD

The invention relates to a plug connector part for electrical connection to a mating plug connector part, to a charging arrangement for charging and/or discharging an electric vehicle, and to an electric vehicle.

BACKGROUND

In particular in the field of e-mobility, particularly high requirements in terms of functional performance, stability, and safety are applied to plug connector parts and charging cables connected thereto. In particular in the case of possible DC charging currents, e.g., up to 500 A with charging voltages up to 1000 V, it is desirable that the performance of the plug connector parts is maintained even during several years of use with a large number of charging cycles.

In the case of plug connector parts, assemblies that conduct high voltages and are exposed to environmental influences can generally be a potential source of danger. With such assemblies, there is a risk of leaks arising due to damage to housing components and allowing moisture to enter the interior of the plug connector part at one of the aforementioned assemblies. In the field of e-mobility, the possibility of contamination by salt water, i.e., by a highly conductive electrolyte, presents an additional difficulty. Such penetrated moisture can lead to deterioration of the insulation or even to its failure, e.g., due to arcing.

DE 10 2016 105 311 A1 describes a plug connector part with a contact holder, which has a base body provided with an electrically insulating sheath.

SUMMARY

In an embodiment, the present invention provides a plug connector part for electrical connection to a mating plug connector part, comprising: a housing; at least two load contacts; a protective conductor contact; and a grounding element arranged in the housing and electrically connected to the protective conductor contact, wherein the grounding element extends in an electrically contactable manner on a creep path between the at least two load contacts.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

In an embodiment, the present invention provides a safe plug connector part.

Accordingly, a plug connector part is provided for electrical connection to a mating plug connector part, with a housing, at least two load contacts, a protective conductor contact, and a grounding element arranged in the housing and electrically connected to the protective conductor contact. In this case, it is provided that the grounding element extends in an electrically contactable manner (e.g., by moisture, in particular penetrating water) at least in sections on a creep path between the two load contacts.

Such a plug connector part enables insulation monitoring between the load contacts, whereby safety, in particular with respect to arcing, can be significantly increased. The plug connector part can, for example, be a vehicle charging socket or a charging plug (e.g., of a charging station).

The grounding element can in particular extend in an electrically contactable manner at least in sections on the shortest creep path between the two load contacts. In this case, the creep path with a comparatively high risk of defective insulation can be monitored.

Optionally, the grounding element extends spatially between the load contacts at least in sections. As a result, particularly reliable insulation monitoring is possible.

In one embodiment, the plug connector part comprises an in particular electrically insulating contact carrier, which holds the load contacts on the housing. This enables simple mounting and reliable holding of the load contacts.

In a development, the grounding element comprises a projecting, e.g., flat, section, in particular in the form of a blade. In this case, the projecting section, e.g., a projection or the blade, can extend through an opening in the contact carrier. As a result, the insulation of the load contacts can be monitored particularly reliably with the grounding element.

Optionally, the contact carrier comprises an insulation contour for each of the load contacts. In this case, it can be provided that the blade of the grounding element extends at least in sections between the insulation contours.

According to one embodiment, the plug connector part comprises a plug body which has an insulation contour for each of the load contacts. Each of the insulation contours of the plug body can be in engagement with the insulation contour of the contact carrier for the respective load contact. This enables the creep path on which the blade of the grounding element is arranged to be extended.

For each load contact, the contact carrier can have a shielding section for electrical insulation from the respective other load contact, which enables particularly reliable insulation.

In a development, the grounding element can extend at least in sections between the shielding sections and/or at least in sections around the shielding sections in order to further improve insulation monitoring.

At least part of the grounding element can extend at a point that is further below than the load contacts when the plug connector part is connected to the mating plug connector part as intended. If water is able to penetrate into the housing, the water will collect in a lower region. By arranging the grounding element closer to this region than the load contacts, the reliability of the insulation monitoring can be further increased.

Optionally, the grounding element comprises an in particular metallic, electrically conductive body.

The (in particular metallic) body can be electrically connected to the protective conductor contact via a cable, which allows the arrangement of the body to be particularly flexible and thus optimal for insulation monitoring.

The plug connector part may be a high-amperage and/or high-voltage plug connector part. For example, the plug connector part is designed to conduct an electrical power of 10 kW or more, in particular of 50 kW or more, 135 kW or more, or 350 kW or more. For example, the plug connector part is designed to conduct electrical currents with current intensities of 100 A or more, 200 A or more, 300 A or more, in particular of 500 A or more.

The plug connector part can be designed as a vehicle charging plug, in particular for DC high-current charging.

According to one aspect, a charging arrangement for charging and/or discharging an electric vehicle is provided, which comprises the plug connector part according to any embodiment described herein and an insulation monitoring device electrically connected or connectable to the protective conductor contact of the plug connector part. The insulation monitoring device is configured, for example, to detect an electrical voltage applied to the protective conductor contact with respect to a ground potential, for example before a charging process is initiated. The charging arrangement is, for example, part of a vehicle or of a stationary charging station connected to a power grid.

According to one aspect, an electric vehicle is provided, which comprises the plug connector part according to any embodiment described herein and/or the charging arrangement according to any embodiment described herein.

Figure 1:
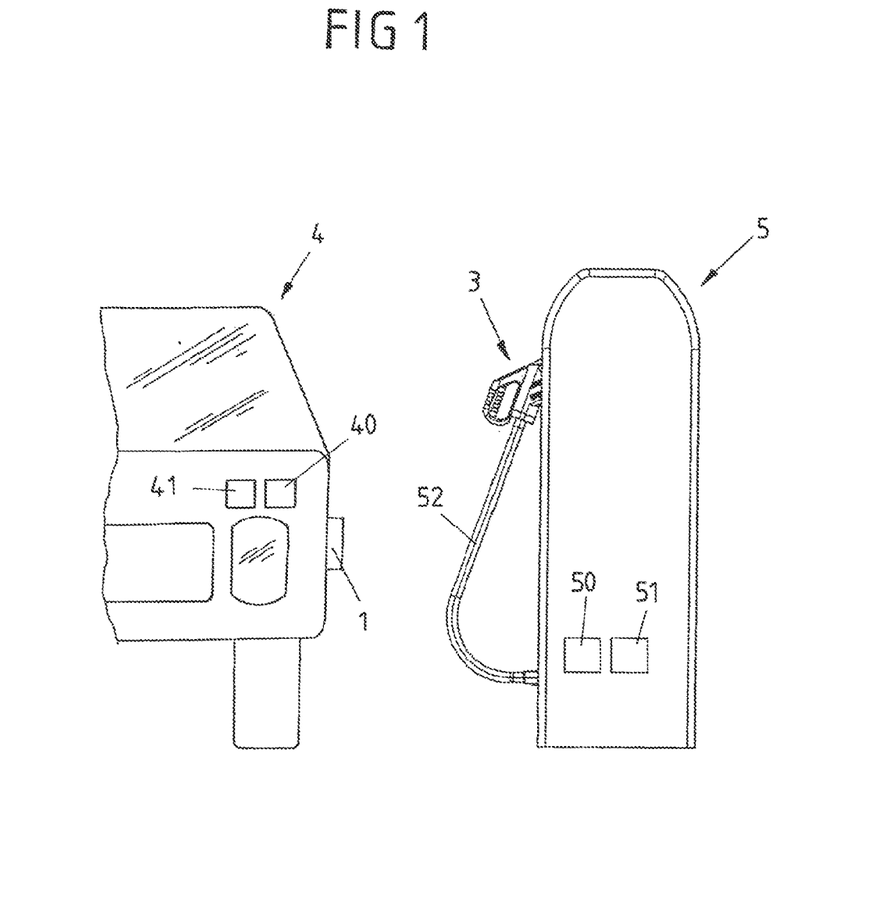
FIG. 1 is a view of a vehicle with a plug connector part and a charging station with a mating plug connector part.

FIG. 1 shows an electrically powered vehicle 4, also referred to as an electric vehicle, with a plug connector part 1, here in the form of a charging socket, for releasable electrical connection to a mating plug connector part 3. The plug connector part 1 and the mating plug connector part 3 together form a plug connector. In addition, FIG. 1 shows a charging station 5 which serves to charge the vehicle 4. The charging station 5 is designed to provide a charging current in the form of a direct current (alternatively or additionally an alternating current) and is connected via a cable 52 to the mating plug connector part 3 in the form of a charging plug.

In the example shown, the mating plug connector part 3 is designed as a manually operable charging plug for the electric vehicle 4.

In the example shown, the charging station 5 furthermore comprises a charging device 50 (in the form of a DC charging device) for charging the vehicle 4 with direct current and/or for receiving direct current provided by the vehicle 4. In addition, the charging station 5 comprises an (optional) insulation monitoring device 51. The insulation monitoring device 51 is designed to detect a potential applied to a protective conductor (protective earth, PE conductor) and/or to measure an electrical resistance between a load contact and the PE conductor.

The vehicle 4 typically comprises a charging device 40 (in the form of a DC charging device) designed to charge a traction battery of the vehicle 4 by means of the direct current provided at the plug connector part 1 and/or to provide energy stored in the traction battery as direct current via the plug connector part 1. The vehicle 4 furthermore comprises an (optional) insulation monitoring device 41. The insulation monitoring device 51 is designed to detect a potential applied to a protective conductor and/or to measure an electrical resistance between a load contact and the protective conductor.

The insulation monitoring device 41 of the vehicle 4 and/or the insulation monitoring device 51 of the charging station 5 can detect if one or more load contacts (in particular the load contacts 11A, 11B shown in FIG. 2) are no longer sufficiently electrically insulated, for example as a result of moisture that has penetrated into the plug connector part 1.

The charging device 40 of the vehicle 4 and/or the charging device 50 of the charging station 5 can be designed to check (e.g., by comparing a measured value of a potential or an electrical resistance with a predetermined threshold value) the insulation of the load contacts (in particular the load contacts 11A, 11B shown in FIG. 2) by means of the insulation monitoring device 41 of the vehicle 4 and/or the insulation monitoring device 51 of the charging column 5 before the start of a charging process of the vehicle 4 (or generally before an energy transmission between the vehicle 4 and the charging station 5 is initiated). The charging device 40 of the vehicle 4 and/or the charging device 50 of the charging station 5 can furthermore be designed to initiate the charging process (generally the energy transmission) only if it has been determined during the check that the insulation is intact, and to not initiate or to abort the charging process (the energy transmission) if it was determined during the check that the insulation is not intact.

Figure 2:
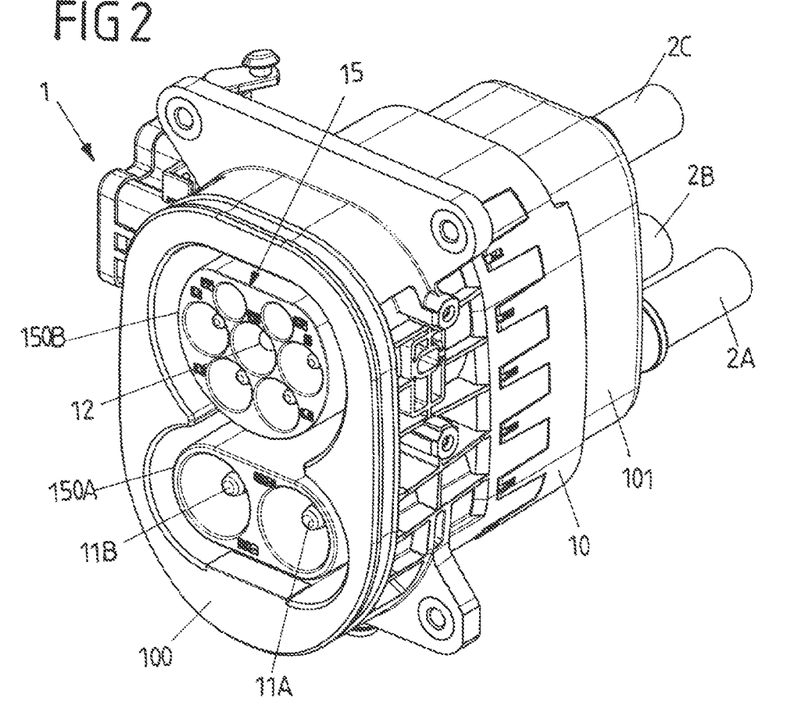
FIGS. 2 and 3 are views of the plug connector part according to FIG. 1 with a housing and a plug body and with cables connected thereto.
Figure 3:
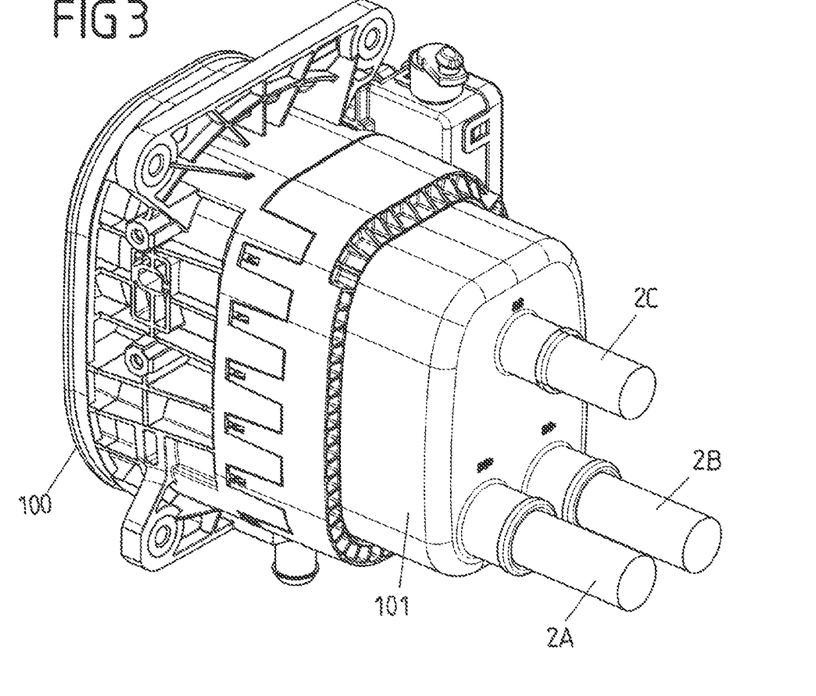

FIGS. 2 and 3 show the plug connector part 1. In the present case, the plug connector part 1 is designed for mounting on the vehicle 4, specifically as a vehicle inlet, for example according to CCS (Combined Charging System) Type 2.

The plug connector part 1 is designed to transmit a charging current in the form of a direct current and/or in the form of an alternating current.

The plug connector part 1 comprises a housing 10. The housing 10 encloses an interior space. In the present case, the housing 10 comprises several housing parts 100, 101. A plug body 15 is mounted on the housing 10 and, together with the housing 10, defines the interior space and, in particular, seals it against environmental influences, for example against moisture.

The plug body 15 forms at least one plug section, in the present case two plug sections 150A, 150B. The plug sections 150A, 150B are designed to be brought into engagement with corresponding plug sections of the mating plug connector part 3 for electrical contacting. In this case, two load contacts 11A, 11B in the form of plug contacts (on the one plug section 150A) are used for establishing a DC current circuit. The load contacts 11A, 11B are high-amperage load contacts. During, in particular for the duration of, a charging process or discharging process, they can conduct currents of 50 A or more, in particular 100 A or more. Further plug contacts are arranged on the other plug section 150B. The plug connector part 1 comprises in particular a protective conductor contact 12, which in the present case is arranged on that plug section 150B. Further (optional) plug contacts serve, for example, as alternating or three-phase contacts or as data connections.

The plug connector part 1 furthermore comprises a grounding element 13 shown in FIGS. 4 to 13 and described in more detail below, which grounding element is arranged in the housing 10 and electrically connected to the protective conductor contact 12, wherein the grounding element 13 extends in an electrically contactable manner on a creep path between the two load contacts 11A, 11B.

It should be pointed out that a correspondingly arranged grounding element can likewise, alternatively or additionally, be provided in the mating plug connector part 3.

For connection to the charging device 40 and/or to the insulation monitoring device 41, cables 2A-2C are connected to the plug connector part 1. In each case one of the cables 2A-2C serves to connect to one of the two load contacts 11A, 11B. A further cable 2C guides a protective conductor 20 electrically connected to the protective conductor contact 12. Together with the cables 2, the plug connector part 1 forms a plug connector arrangement. Optionally, some of the cables 2A-2C are combined to form a cable bundle.

Figure 4:
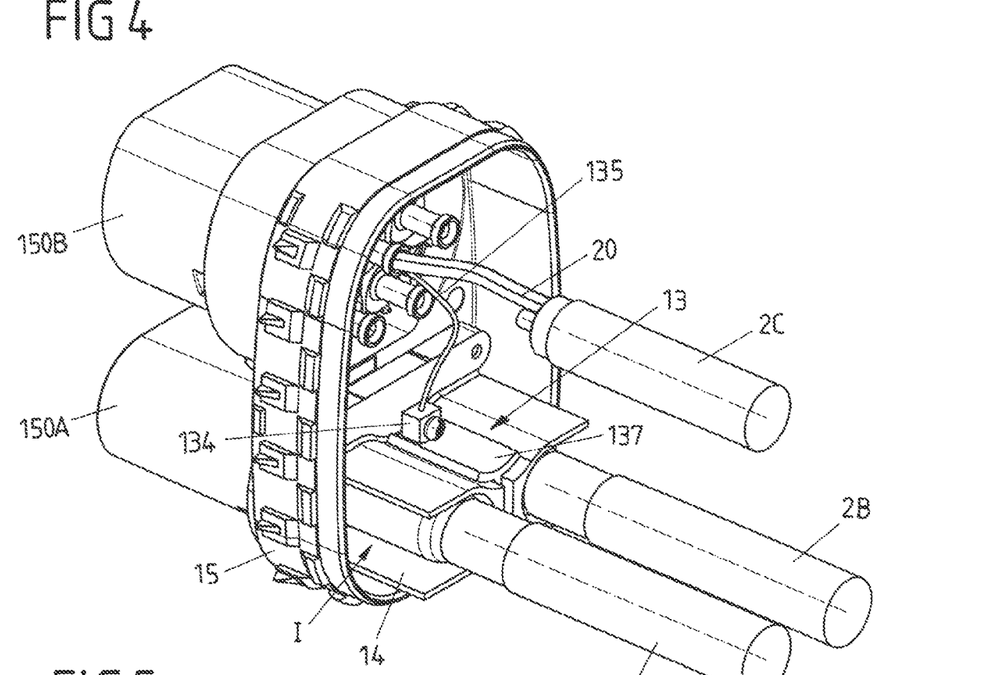
FIG. 4 is a view of the plug body and further parts of the plug connector part according to FIGS. 2 and 3.

FIG. 4 shows the plug connector part 1 without housing 10 so that part of the interior space I of the plug connector part 1 defined by the housing 10 and by the plug body 15 can be seen. The grounding element 13, which comprises an electrically conductive, e.g., metallic, body 137, is arranged in the interior space I. The body 137 is electrically connected to the protective conductor contact 12. In the present case, the body 137 is connected via a cable 135 to a connection which is connected to the protective conductor contact 12 and to which a protective conductor 20 of the cable 2C is also electrically connected. In the example shown, the cable 135 is electrically connected to the body 137 via a screw terminal 134. The screw terminal 134 is arranged on the body 137, in particular firmly connected thereto, e.g., welded thereto.

In addition, a contact carrier 14 is arranged in the interior space I. The load contacts 11A, 11B are attached to the contact carrier 14. The contact carrier 14 is firmly connected to the plug body 15, e.g., screwed thereon.

Figure 5:
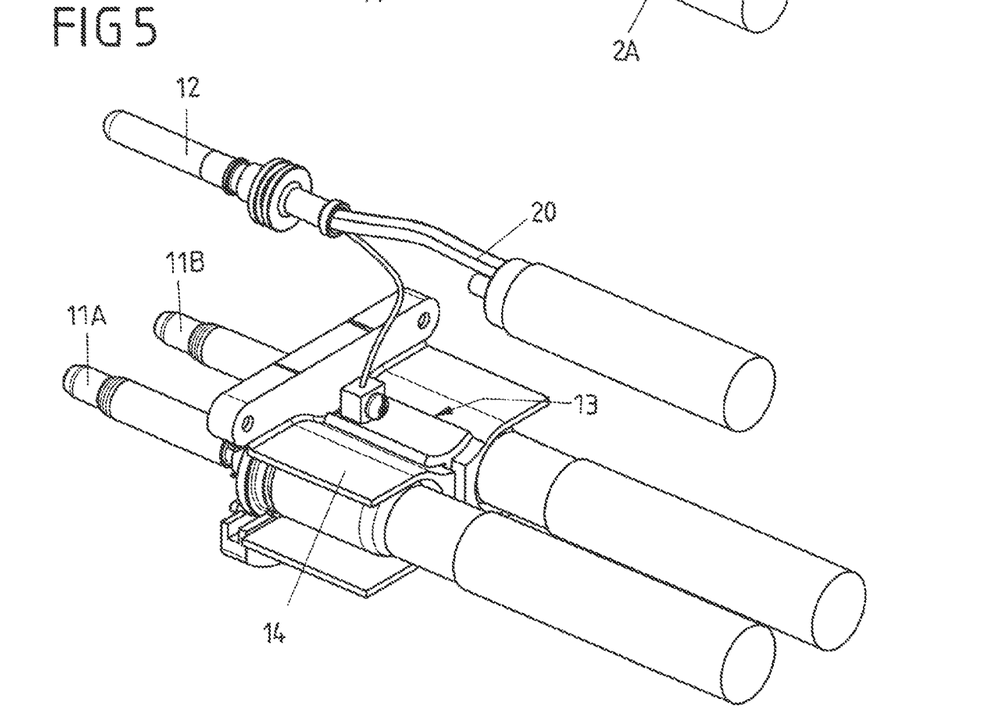
FIG. 5 is a view of a contact carrier with load contacts held thereon, a grounding element, and a protective conductor contact of the plug connector part according to FIGS. 2 and 3.
Figure 6:
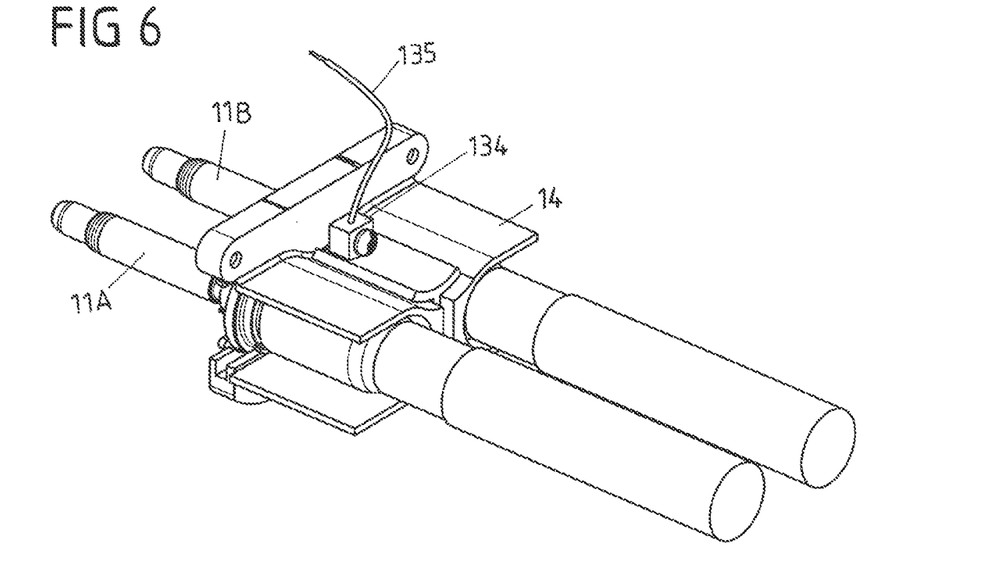
FIG. 6 is a view of the contact carrier with the load contacts held thereon and of the grounding element of the plug connector part according to FIGS. 2 and 3.

As can be seen, for example, from FIGS. 5 and 6, the contact carrier 14 and the grounding element 13 are in engagement with one another.

Figure 7:
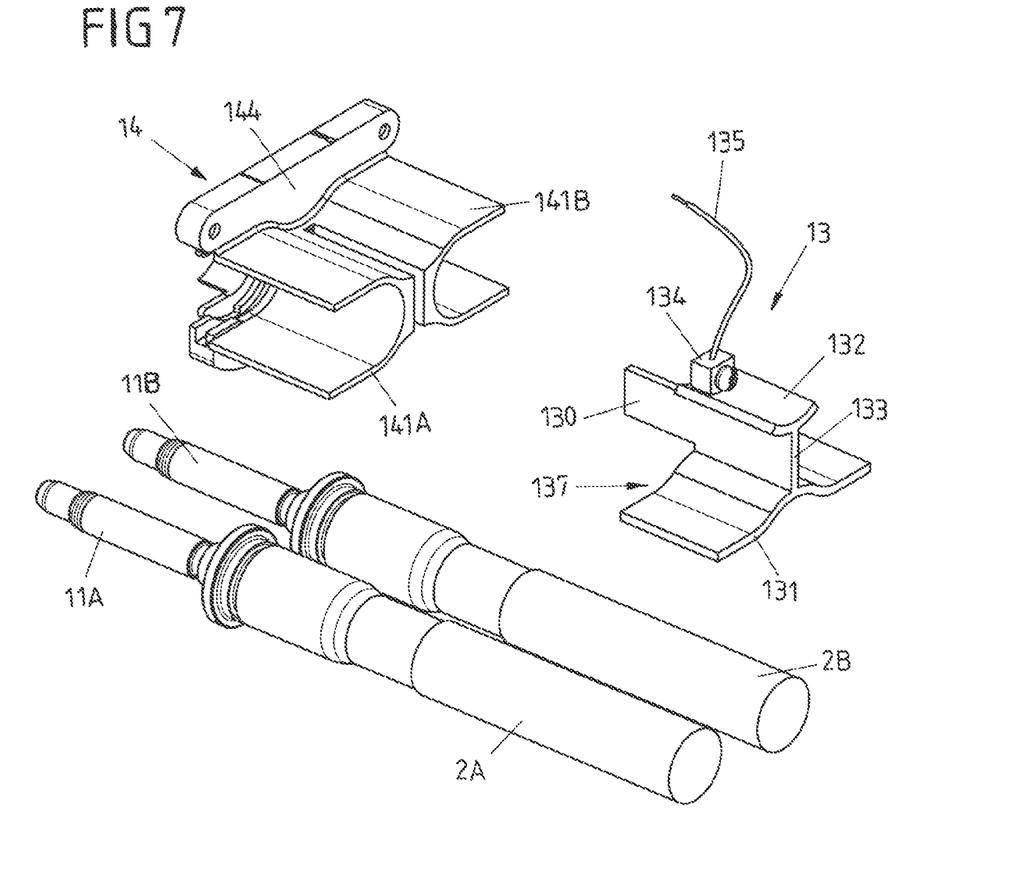
FIG. 7 is an exploded view of the components, shown in FIG. 6, of the plug connector part according to FIGS. 2 and 3.

In this case, a central section 133, shown in particular in FIG. 7 (in general: a section), of the grounding element 13 is arranged between two shielding sections 141A, 141B (in general: sections) of the contact carrier 14. The shielding sections 141A, 141B of the contact carrier 14 each have a U-shaped cross-section. In the mounted state, in each case one of the cables 2A, 2B is partially surrounded by in each case one of the shielding sections 141A, 141B. The shielding sections 141A, 141B each have an opening, wherein the openings of the shielding sections 141A, 141B face away from one another (in particular when viewed in cross-section). The shielding sections 141A, 141B serve in particular for the electrical insulation of the load contact 11A, 11B accommodated therein from the respective other load contact 11A, 11B.

The shielding sections 141A, 141B project from a mounting section 144. The mounting section 144 serves for mounting the contact carrier 14 on the plug body 15.

Figure 8:
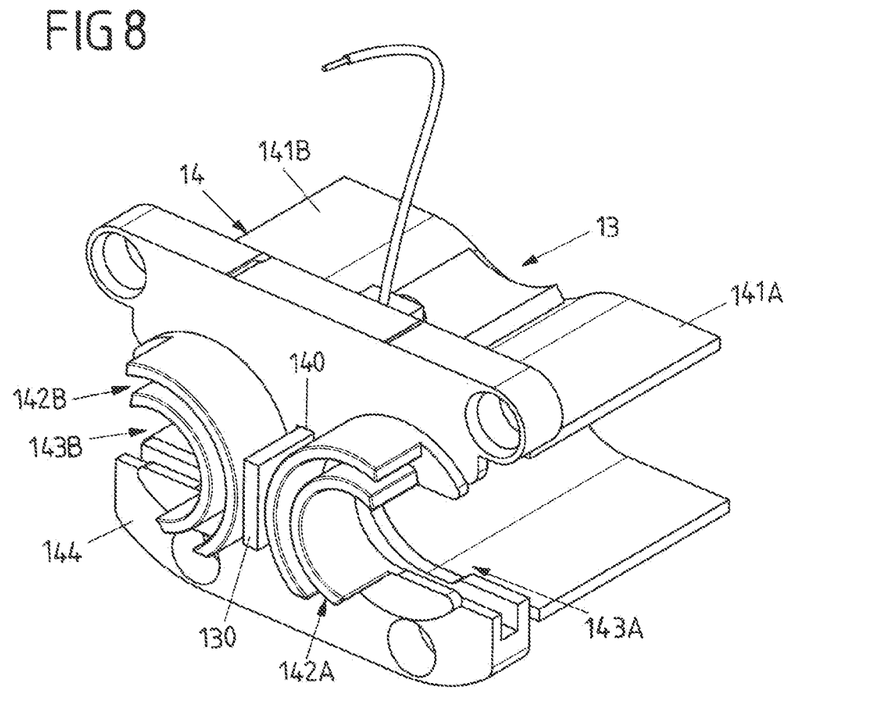
FIGS. 8 and 9 are views of the contact carrier and the grounding element of the plug connector part according to FIGS. 2 and 3.
Figure 9:
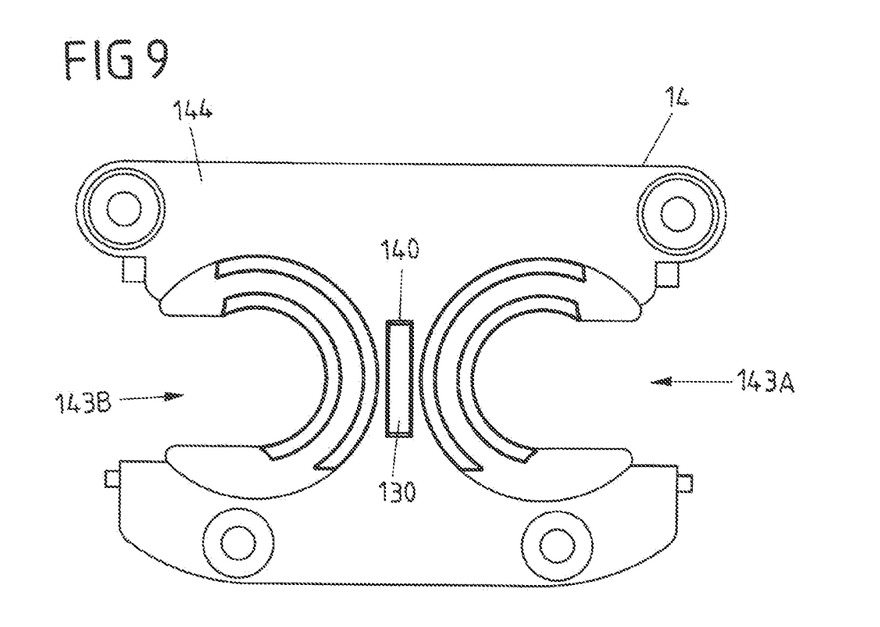

Together with each of the shielding sections 141A, 141B, the mounting section 144 forms a receptacle 143A, 143B for in each case one of the load contacts 11A, 11B; see in particular FIGS. 8 and 9. In this case, each of the load contacts 11A, 11B can be inserted into one of the two receptacles 143A, 143B, namely coming from opposite directions in the present case. The load contacts 11A, 11B each have a collar. The respective collar can in each case be inserted into a corresponding recess (on the mounting section 144 in the example shown, and in the form of a respective circumferential groove in the present case) on the corresponding receptacle 143A, 143B in order to axially secure each of the load contacts 11A, 11B.

The grounding element comprises a lower wing section 131 and an upper wing section 132. The wing sections 131, 132 are arranged on opposite sides of the central section 133. The wing sections 131, 132 each project from the central section 133 on both sides, namely in the present case in such a way that they jointly partially surround the shielding sections 141A, 141B. The lower wing section 131 arranged below the upper wing section 132 when the plug connector part 1 is used as intended is larger than the upper wing section 132.

It can be seen in particular from the combination of FIGS. 6 and 7 that part of the grounding element 13, in the present case the lower wing section 131, is arranged below the load contacts 11A, 11B during the intended use. As a result, moisture collecting at the bottom in the housing 10 can be detected particularly reliably and at an early stage.

The grounding element 13 furthermore comprises a projecting section 130, which is designed in the form of a blade in the example shown. The projecting section 130 projects from the central section 133 and, in the example shown, represents an extension of the central section 133 that projects in relation to the wing sections 131, 132. In the present case, the projecting section 130 is flat and planar.

As illustrated in particular by FIGS. 8 and 9, the projecting section 130 extends in the mounted state through an opening 140 in the contact carrier 14, in the present case in the mounting section 144 of the contact carrier 14. In the example shown, the projecting section 130 extends through the opening 140 in the axial direction in relation to the orientation of the load contacts 11A, 11B (parallel to one another). The projecting section 130 is arranged between the two receptacles 143A, 143B of the contact carrier 14 for the load contacts 11A, 11B. In the mounted state, the projecting section 130 is arranged between the two load contacts 11A, 11B.

On both sides of the projecting section 130 of the grounding element 13, the contact carrier 14 has in each case one insulation contour 142A, 142B. The insulation contours 142A, 142B each have two segments, arranged coaxially with one another, of circular cylinders with different radii. These segments are arranged such that no water can collect therein during the intended use, for which purpose they are open laterally and downwardly in the present case. The segments in each case form part of the respective receptacle 143A, 143B. The insulation contours 142A, 142B serve to extend a creep path between the two load contacts 11A, 11B, along which an electrical connection between the load contacts 11A, 11B could be established as a result of penetrated moisture. The projecting section 130 of the grounding element 13 is arranged on this creep path. As a result, a defective insulation between the two load contacts 11A, 11B is reliably detected (e.g., by means of one of the insulation monitoring devices 41, 51).

The insulation contours 142A, 142B protrude from the mounting section 144, specifically on a side opposite the shielding sections 141A, 141B.

Figure 10:
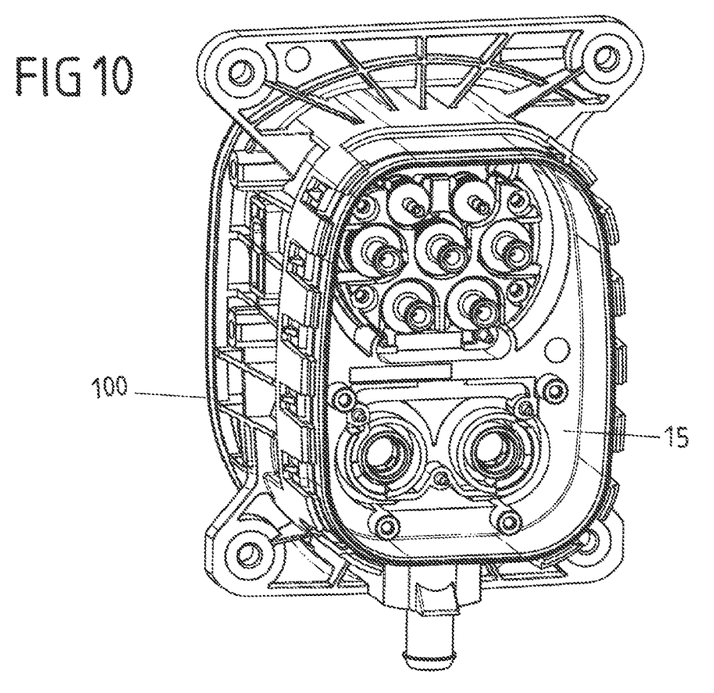
FIGS. 10 and 11 are views of a housing part with the plug body of the plug connector part according to FIGS. 2 and 3 mounted thereon.
Figure 11:
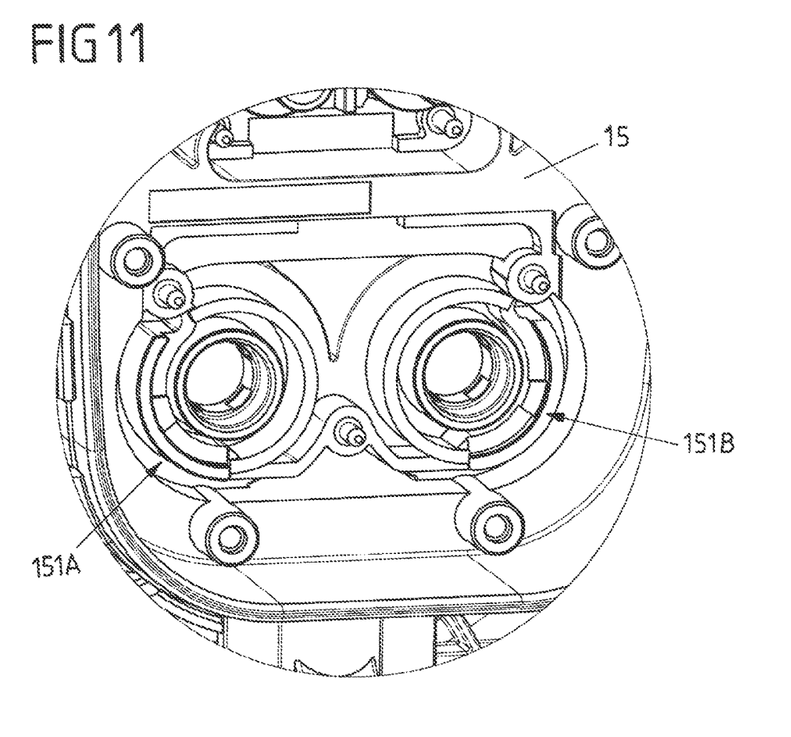

FIGS. 10 and 11 show in particular that the plug body 15 has insulation contours 151A, 151B. The insulation contours 151A, 151B are designed to match the insulation contours 142A, 142B of the contact carrier 14 so that they can be brought into engagement therewith and are in engagement therewith in the mounted state.

It can furthermore be seen from FIG. 10 and, for example, from FIG. 2 that the (DC) load contacts 11A, 11B in the plug connector part 1 are arranged closer to one another than each of the load contacts 11A, 11B to the protective conductor contact 12. Furthermore, the load contacts 11A, 11B are arranged below the protective conductor contact 12 (during use).

Figure 12:
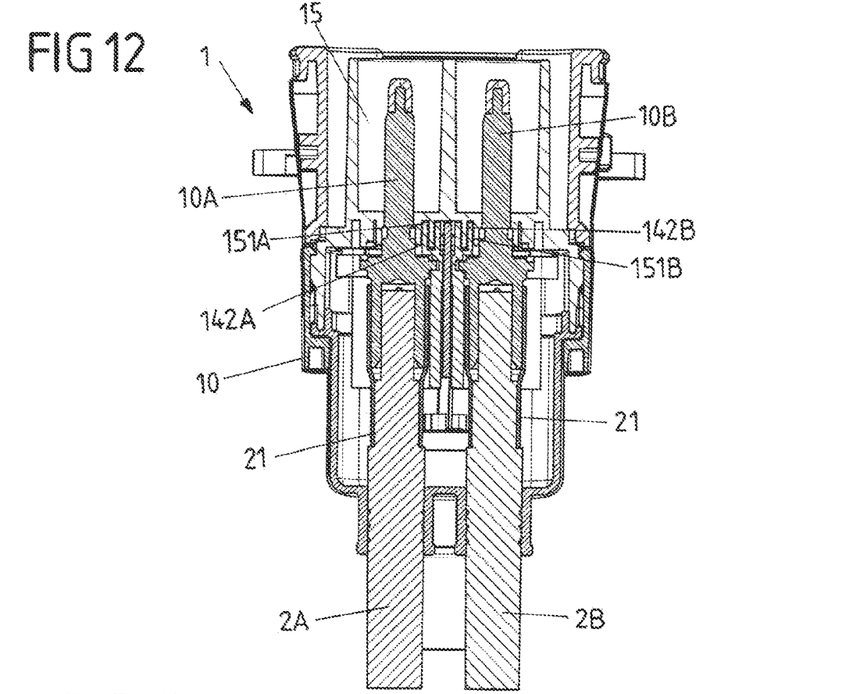
FIGS. 12 and 13 are cross-sectional views of the plug connector part according to FIGS. 2 and 3.
Figure 13:
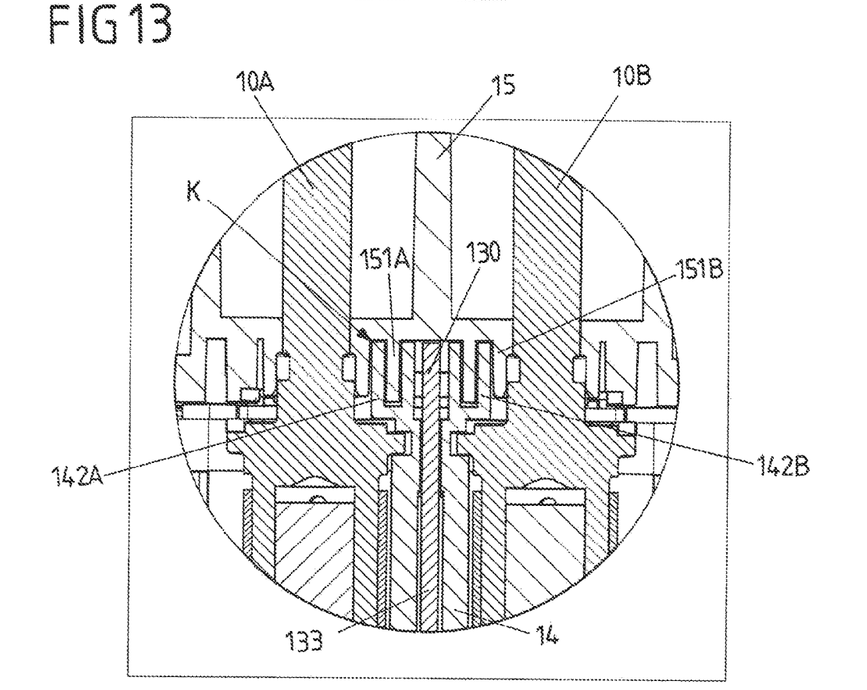

In the cross-sectional view, FIGS. 12 and 13 show the mounted state of the plug connector part 1. It can be seen in particular that the insulation contours 142A, 142B, 151A, 151B of the contact carrier 14 and the plug body 15 are in engagement with one another, namely in the present case in particular in a region between the two load contacts 11A, 11B. This results in the formation of a kind of meandering course.

It is furthermore illustrated that the projecting section 130 extends between the respectively engaged insulation contours 142A, 142B, 151A, 151B of the contact carrier 14 and the plug body 15.

Within the respective shielding section 141A, 141B (and beyond them), each of the load contacts 11A, 11B and a conductor of the respective cable 2A, 2B connected thereto are enclosed by a jacket 21, which is produced, for example, from an insulation material.

Despite the meandering course through the engaged insulation contours 142A, 142B, 151A, 151B of the contact carrier 14 and the plug body 15, the shortest creep path K extends between the load contacts 11A, 11B between the contact carrier 14 (in the present case the mounting section 144 of the contact carrier 14) and the plug body 15. It can be seen in particular in FIG. 13 that the grounding element 13, in particular the projecting section 130 of the grounding element 13, is arranged on the shortest creep path K. As a result, inadequate insulation can be detected particularly reliably.

The body 137 of the grounding element 13 consists, for example, of metal or another electrically conductive material and can be contacted electrically by contact (at any point), e.g., by water. In the present case, the body 137 of the grounding element 13 is formed as one part but can alternatively also be designed in multiple parts.

Optionally, the grounding element 13 also serves as a heat sink. For example, a coolant is applied to it, e.g., flows through it.

Let it be once again pointed out that the grounding element 13 designed and arranged as described can be used in the same mode of action not only in vehicle charging sockets but also in charging plugs on charging stations.

While subject matter of the present disclosure has been illustrated and described in detail in the drawings and foregoing description, such illustration and description are to be considered illustrative or exemplary and not restrictive.

Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

1 Plug connector part
10 Housing
100, 101 Housing part
11A, 11B Load contact
12 Protective conductor contact
13 Grounding element
130 Projecting section (blade)
131 Lower wing section
132 Upper wing section
133 Central section
134 Screw terminal
135 Cable
137 Body
14 Contact carrier
140 Opening
141A, 141B Shielding section
142A, 142B Insulation contour
143A, 143B Receptacle
144 Mounting section
15 Plug body
150A, 150B Plug section
151A, 151B Insulation contour
2A-2C Cable
20 Protective conductor
21 Jacket
3 Mating plug connector part
4 Vehicle
40 Charging device
41 Insulation monitoring device
5 Charging station
50 Charging device
51 Insulation monitoring device
52 Cable
I Interior space
K Creep path

The invention claimed is:

1. A plug connector part for electrical connection to a mating plug connector part, comprising:

a housing;

at least two load contacts;

a protective conductor contact;

a grounding element arranged in the housing and electrically connected to the protective conductor contact; and an electrically insulating contact carrier, which holds the at least two load contacts on the housing, wherein the grounding element extends in an electrically contactable manner on a creep path between the at least two load contacts, and wherein the grounding element comprises a blade, which extends through an opening in the contact carrier.

2. The plug connector part of claim 1, wherein the grounding element extends in an electrically contactable manner on a shortest creep path between the at least two load contacts.

3. The plug connector part of claim 1, wherein the grounding element extends between the at least two load contacts.

4. The plug connector part of claim 1, wherein the contact carrier has an insulation contour for each of the at least two load contacts, and wherein the blade of the grounding element extends at least in sections between the insulation contours.

5. The plug connector part of claim 4, further comprising:

a plug body, which has, for each of the at least two load contacts, an insulation contour, which is in engagement with the insulation contour of the contact carrier for a respective load contact of the at least two load contacts.

6. The plug connector part of claim 1, wherein the contact carrier has, for each load contact of the at least two load contacts, a shielding section for electrical insulation from a respective other load contact of the at least two load contacts.

7. The plug connector part of claim 6, wherein the grounding element extends between the shielding sections and at least partially around the shielding sections.

8. The plug connector part of claim 1, wherein at least part of the grounding element extends at a point farther below the at least two load contacts when the plug connector part is connected to the mating plug connector part.

9. The plug connector part of claim 1, wherein the grounding element comprises a metallic body.

10. The plug connector part of claim 9, wherein the metallic body is electrically connected via a cable to the protective conductor contact.

11. The plug connector part of claim 1, wherein the plug connector part is configured to conduct an electrical power of 10 kW or more.

12. The plug connector part of claim 1, wherein the plug connector part comprises a vehicle charging plug for DC high-current charging.

13. A charging arrangement for charging and/or discharging an electric vehicle, comprising:

the plug connector part of claim 1; and an insulation monitoring device which is electrically connected or connectable to the protective conductor contact of the plug connector part and configured to detect an electrical voltage applied to the protective conductor contact with respect to a ground potential.

14. An electric vehicle, comprising:

the plug connector part of claim 1.

15. An electric vehicle, comprising:

the charging arrangement of claim 13.

* * * * *